United States Patent [19]
Knauft et al.

[11] Patent Number: 5,306,959
[45] Date of Patent: Apr. 26, 1994

[54] ELECTRICAL CIRCUIT FOR GENERATING PULSE STRINGS

[75] Inventors: Guenter Knauft, Boeblingen; Bernd Leppla, Grafenau-Datzingen; Dietmar Schmunkamp, Ehningen; Ulrich Weiss, Holzgerlingen, all of Fed. Rep. of Germany

[73] Assignee: International Business Machines Corporation, Armonk, N.Y.

[21] Appl. No.: 858,252

[22] Filed: Mar. 26, 1992

[30] Foreign Application Priority Data

Apr. 30, 1991 [EP] European Pat. Off. ........ 91106970.6

[51] Int. Cl.⁵ .................. H03K 5/04; H03K 5/13; H03K 3/284; H03K 7/00
[52] U.S. Cl. .................. 307/269; 307/272.1; 307/265; 307/602; 307/595; 328/58; 328/63; 328/66; 328/72
[58] Field of Search .......... 307/272.1, 272.2, 279, 307/289, 291, 269; 328/63

[56] References Cited

U.S. PATENT DOCUMENTS

| | | | |
|---|---|---|---|
| 3,971,960 | 7/1976 | Means et al. ................ | 307/289 |
| 4,607,173 | 8/1986 | Knoedl, Jr. ................ | 307/289 |
| 4,697,279 | 9/1987 | Baratti et al. ............ | 307/272.1 |
| 4,761,568 | 8/1988 | Stronski ................... | 307/272.1 |
| 4,797,576 | 1/1989 | Asazawa ................... | 307/291 |
| 4,939,384 | 7/1990 | Shikata et al. ........... | 307/272.1 |
| 5,083,049 | 1/1992 | Kagey ..................... | 307/272.1 |
| 5,095,225 | 3/1992 | Usui ...................... | 307/291 |
| 5,155,379 | 10/1992 | Narahara ................. | 307/272.1 |
| 5,166,631 | 11/1992 | Kyrian et al. ........... | 307/269 |

FOREIGN PATENT DOCUMENTS 0226754 10/1986 European Pat. Off. .
3605722 8/1987 Fed. Rep. of Germany .

OTHER PUBLICATIONS

IBM Tech. Disclosure Bulletin vol. 27, No. 8 Jan. 1985. pp. 4934–4937, Synchronization of LSSD System Clocks to Asynchronous Signals.

Primary Examiner—William L. Sikes
Assistant Examiner—Trong Phan
Attorney, Agent, or Firm—Lynn L. Augspurger; William H. Steinberg

[57] ABSTRACT

An electrical circuit for generating clock pulses for a multi-chip computer system which contains a clock generation chip and various logic circuit chips. The clock pulses used on the logic circuit chips are generated on the clock generation chip and are transferred to the logic circuit chips. For the generation of the clock pulses a so-called clock splitter circuit is provided on the clock generation circuit. This clock splitter generates two pulse strings out of a third pulse string which is derived from an oscillator. The clock splitter contains a number of gates and latches which have an impact on the throughput time of a pulse to run through the clock splitter, as well as on the skew of the two generated pulse strings. The invention provides an electrical circuit which has an improved throughput time and skew of the generated pulse strings.

5 Claims, 1 Drawing Sheet

ELECTRICAL CIRCUIT FOR GENERATING PULSE STRINGS

FIELD OF THE INVENTIONS

These inventions relate to computers and computer systems and particularly to an electrical circuit for generating a first and a second pulse string with a first pulse duration out of a third pulse string with a second pulse duration, the second pulse duration being half of the first pulse duration and the second pulse string being shifted by the value of the second pulse duration with regard to the first pulse string. Especially, the invention relates to an electrical circuit for generating clock pulses for use in a computer system.

BACKGROUND OF THE INVENTIONS

Electrical circuits are known for example from multichip computer systems which contain a clock generation chip and various logic circuit chips. The clock pulses used on the logic circuit chips are generated on the clock generation chip and are transferred to the logic circuit chips. For the generation of the clock pulses a so-called clock splitter circuit is provided on the clock generation circuit. This clock splitter generates two pulse strings out of a third pulse string which is derived from an oscillator. The clock splitter contains a number of gates and latches which have an impact on the throughput time of a pulse to run through the clock splitter, as well as on the skew of the two generated pulse strings.

It is an object of the invention to provide an electrical circuit which has an improved throughput time and skew of the generated pulse strings.

SUMMARY OF THE INVENTION

According to the invention this object is solved by an electrical circuit comprising two shift register latches having two pulse inputs, one data input and one data output, respectively, the third pulse string and the inversion of the third pulse string being applied to one of the two pulse inputs of the two shift register latches, respectively, and the other one of the two pulse inputs of the two shift register latches being supplied with a signal such that the data input and the data output of the shift register latches are internally connected, respectively, and the data output of one of the shift register latches being coupled to the data input of the other one of the shift register latches, respectively, and further comprising inverting means being provided within one of the two feedback paths from the data outputs to the data inputs of the shift register latches, the data outputs carrying the first and the second pulse string.

Due to the internal connection of the two shift register latches and due to the respective feedback paths between the two shift register latches, the first and the second pulse string mainly depend on the third pulse string. As the third pulse string only has to run through a minor number of gates, the throughput time and especially the skew of the two generated pulse strings is improved.

In an embodiment of the invention delaying means are provided in the respective feedback paths of the two shift register latches. These delaying means improve the proper function of the circuit.

In another embodiment of the invention inverting means are provided for generating the inversion of the third pulse string. This is the only gate which the third pulse string has to run through in one of two paths to the two shift register latches.

These and other improvements, illustrating all three architectural approaches, are set forth in the following detailed description. For a better understanding of the inventions with advantages and features, reference may be had to the improvements, advantages and features described herein, and reference will be made in the description which follows to the below-described drawings.

DETAILED DESCRIPTION OF THE INVENTIONS

Figure 1:
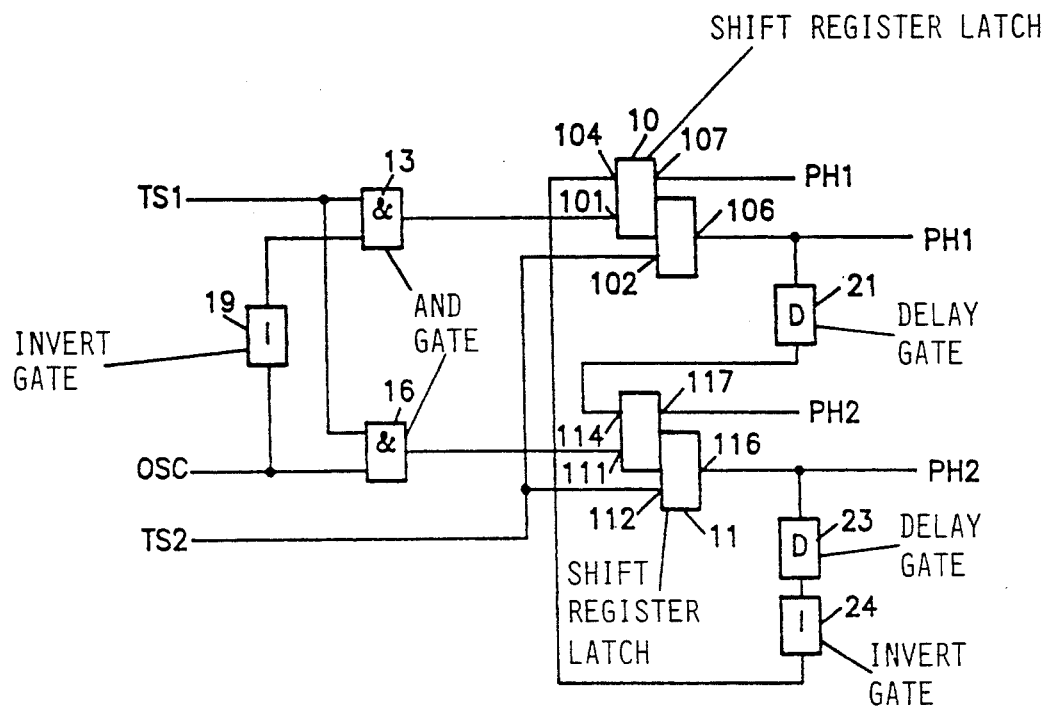
FIG. 1 shows a block diagram of an electrical circuit for generating pulse strings according to the invention.

Turning now to our inventions in greater detail, it will be seen from the electrical circuit shown in FIG. 1 that our preferred embodiment provides two shift register latches (10, 11) with two pulse inputs (101, 102; 111, 112), one data input (104, 114) and two data outputs (106, 107; 116, 117), respectively.

The first pulse input (101, 111) of each shift register latch (10, 11) is connected with the output of an AND gate (13, 16). One of the two inputs of the AND gates (13, 16) are supplied with a first test signal (TS1). The other input of the AND gate (16) is supplied with a third pulse string (OSC) whereas the other input of the AND gate (13) is supplied via an INVERT gate (19) with the inversion of the third pulse string (OSC).

The second pulse input (102, 112) of each shift register latch is supplied with a second signal (TS2).

The data input (104) of the first shift register latch (10) is connected via an INVERT gate (24) and a DELAY gate (23) with the data output (116) of the second shift register latch (11). The data input (114) of the second shift register latch (11) is connected via a DELAY gate (21) with the data output (106) of the first shift register latch (10). The delay time of the DELAY gates (21, 23) is less than half of the second pulse duration (T2).

At the data outputs (106, 107) of the first shift register latch (10) a first pulse string (PH1) is available whereas at the data outputs (116, 117) of the second shift register latch (11) a second pulse string (PH2) is available.

Figure 2:
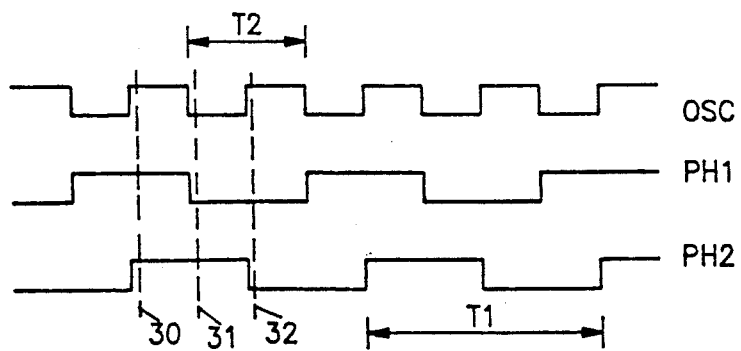
FIG. 2 shows a timing diagram of three electrical signals of the circuit of FIG. 1.

The first, second and third pulse string (PH1, PH2, OSC) are shown in FIG. 2. The first and the second pulse string (PH1, PH2) have a first pulse duration (T1) and the third pulse string (OSC) has a second pulse duration (T2). As can be seen from FIG. 2, the second pulse duration (T2) is half of the first pulse duration (T1) and the second pulse string (PH2) is shifted by the one half the value of the second pulse duration (T2) with regard to the first pulse string (PH1).

The first test signal (TS1) can be used for test purposes, e.g. for testing the function of the circuit by supplying only one pulse of the third pulse string (OSC). This can be achieved by ANDing an appropriate test signal (TS1) with the third pulse string (OSC). In operation, the first test signal (TS1) has the binary value "1".

With the first test signal (TS1) having the binary value "1" the inversion of the third pulse string (OSC) is supplied to the pulse input (101) of the first shift register latch (10) and therefore the transitioning edge going from "0" to "1" of the inverted OSC signal determines the moment of the taking over of data into the data input (104) of the first shift register latch (10). Under the same condition, the third pulse string (OSC) is supplied to the pulse input (111) of the second shift register latch (11) and therefore determines the moment of the taking over of data into the data input (114) of the second shift register latch (11). For both shift register latches (10, 11) the moment of the taking over of data into their data input (104, 114) is determined by the transition of the respective signal at the pulse input (101, 111) from the binary value "0" to the binary value "1". As the first shift register latch (10) is supplied with the inversion of the third pulse string (OSC) the moment of the taking over of data into the data input (104) of the first shift register latch (10) is shifted by the value of half of the second pulse duration (T2) with regard to the moment of the taking over of data into the data input (114) of the second shift register latch (11).

The second signal (TS2) could be used for taking over the data from the first data output (107, 117) to the second data output (106, 116) of the shift register latches (10, 11). However, in the current electrical circuit shown in FIG. 2, the second signal (TS2) is not used in that manner but it has a binary value such that the first data output (107, 117) and the second data output (106, 116) of the shift register latches (10, 11) are internally connected all the time. In other words, the second signal (TS2) has a binary value such that the first data output (107, 117) and the second data output (106, 116) of the shift register latches (10, 11) always carry the same binary value. In operation, the second signal (TS2) has the binary value "1".

If, for example, the second pulse string (PH2) has just become the binary value "1", the first pulse string (PH1) has also the binary value "1". The binary value "1" of the second pulse string (PH2) is delayed by the DELAY gate (23). This situation is depicted with reference number 30 in FIG. 2. Prior to the next 1-0 transition of the third pulse string (OSC) the binary value "1" of the second pulse string (PH2) is inverted into the binary value "0" by the INVERT gate (24) and reaches the data input (104) of the first shift register latch (10). With this next 0-1 transition of the third pulse string (OSC) the binary value "0" is taken over to the data output (106) of the first shift register latch (10) and therefore the first pulse string (PH1) has now the binary value "0". The binary value "0" of the first pulse string (PH1) is delayed by the DELAY gate (21). This situation is depicted with reference number 31 in FIG. 2. Prior to the next 0-1 transition of the third pulse string (OSC) the binary value "0" of the first pulse string (PH1) reaches the data input (114) of the second shift register latch (11). With this next 0-1 transition of the third pulse string (OSC) the binary value "0" is taken over to the data output (116) of the second shift register latch (11) and therefore the second pulse string (PH2) has now the binary value "0". This situation is depicted with reference number 32 in FIG. 2. The binary value "0" of the second pulse string (PH2) is delayed and inverted again and with the next 1-0 transition of the third pulse string (OSC) the first pulse string (PH1) becomes the binary value "1" again; etc.

The transitions of the first and the second pulse strings (PH1, PH2) only depend on the transitions of the third pulse string (OSC). The number of gates which the third pulse string (OSC) has to run through is very low. Without the first test signal (TS1) and therefore without the AND gates (13, 16) there would remain only the INVERT gate (19) in the path of the third pulse string (OSC). As a consequence, the throughput time as well as the skew of the electrical circuit shown in FIG. 2 is very good.

While we have described our preferred embodiments of our inventions, it will be understood that those skilled in the art, both now and in the future, upon the understanding of these discussions will make various improvements and enhancements thereto which fall within the scope of the claims which follow. Throughout the claims we have added reference numerals which correspond to the detailed description and drawings, by way of illustration only. These reference numbers should not be considered as limiting the scope of the inventions. These claims should be construed to maintain the proper protection for the inventions first disclosed.

What is claimed is:

1. An electrical circuit, comprising
means for generating a first and a second pulse string (PH1, PH2) having a first pulse duration (T1) using a third pulse string (OSC) having a second pulse duration (T2),
the second pulse duration (T2) being half of the first pulse duration (T1) and the second pulse string (PH2) being shifted by the value of the second pulse duration (T2) with regard to the first pulse string (PH1),
comprising:
two shift register latches (10, 11),
each having two pulse inputs (101, 102, 111, 112), one data input (104, 114) and two data outputs (106, 107, 116, 117), respectively,
the third pulse string (OSC) and the inversion of the third pulse string (OSC) being applied to one of the two pulse inputs (101, 111) of the two shift register latches (10, 11), respectively, and the other one of the two pulse inputs (102, 112) of the two shift register latches (10, 11) being supplied with a signal (TS2) such that the data outputs (106, 107, 116, 117) of the shift register latches (10, 11) are internally connected, respectively, and the data output (106, 116) of one of the shift register latches (10, 11) being coupled to the data input (114, 104) of the other one of the shift register latches (11, 10), respectively,
and further comprising:
inverting means (24) being provided within one of the two feedback paths from the data outputs (106, 116) to the data inputs (114, 104) of the shift register latches (10, 11),
the data outputs (106, 116) carrying the first and the second pulse string (Ph1, PH2).

2. An electrical circuit according to claim 1
further comprising:
delaying means (21, 23) being provided within the two feedback paths from the data outputs (106, 116) to the data inputs (114, 104) of the shift register latches (10, 11).

3. An electrical circuit according to claim 1
further comprising:
inverting means (19) for generating the inversion of the third pulse string (OSC).

4. An electrical circuit according to claim 1
further comprising:
AND gates (13, 16) for supplying a signal (TS1) for test purposes.

5. An electrical circuit according to claim 4
wherein said circuit is used in a computer system.

* * * * *